(12) United States Patent
Lee et al.

(10) Patent No.: US 6,704,383 B2
(45) Date of Patent: Mar. 9, 2004

(54) SAMPLE AND HOLD TYPE FRACTIONAL-N FREQUENCY SYNTHESIZER

(75) Inventors: Jeongwoo Lee, Seoul (KR); Yido Koo, Seoul (KR); Kang Yoon Lee, Seoul (KR); Eunseok Song, Seoul (KR); Hyungki Huh, Kyung-Ki-Do (KR); Joonbae Park, Seoul (KR); Kyeongho Lee, Seoul (KR)

(73) Assignee: GCT Semiconductor, Inc., San Jose, CA (US)

( * ) Notice: Subject to any disclaimer, the term of this patent is extended or adjusted under 35 U.S.C. 154(b) by 0 days.

(21) Appl. No.: 09/940,808

(22) Filed: Aug. 29, 2001

(65) Prior Publication Data

US 2002/0136342 A1 Sep. 26, 2002

Related U.S. Application Data

(60) Provisional application No. 60/276,912, filed on Mar. 20, 2001.

(51) Int. Cl.$^7$ ............................... H03D 3/24; H03L 7/06
(52) U.S. Cl. .................. 375/376; 375/375; 327/156; 327/157
(58) Field of Search .................. 375/371, 373, 375/374, 375, 326, 327, 376; 327/146–150, 155–159

(56) References Cited

U.S. PATENT DOCUMENTS

| | | | |
|---|---|---|---|
| 4,868,513 A | | 9/1989 | Piercy et al. ............... 328/134 |
| 5,339,050 A | * | 8/1994 | Llewellyn ..................... 331/16 |
| 5,774,023 A | * | 6/1998 | Irwin .......................... 327/105 |
| 5,815,016 A | * | 9/1998 | Erickson ..................... 327/158 |
| 5,838,205 A | * | 11/1998 | Ferraiolo et al. ........... 327/147 |
| 5,872,520 A | * | 2/1999 | Seifert et al. ............... 333/154 |
| 5,909,474 A | * | 6/1999 | Yoshizawa ................... 327/156 |
| 5,953,386 A | * | 9/1999 | Anderson .................... 327/156 |
| 6,388,536 B1 | * | 5/2002 | Welland ...................... 327/107 |

\* cited by examiner

*Primary Examiner*—Tesfaldet Bocure
(74) *Attorney, Agent, or Firm*—Fleshner & Kim, LLP

(57) ABSTRACT

A phase-locked loop (PLL) fractional-N type frequency synthesizer incorporates a sample-and-hold circuit. The synthesizer can reduce circuit size by eliminating a loop filter. Further, the synthesizer can incorporate fractional spur compensation circuitry to compensate charge pump ripple whenever a charge pump operates. The synthesizer or fractional-N type PLL can use a divider and at least two phase detectors coupled to a sample-and-hold circuit. A lock detecting circuit can initially determine a reference voltage for the sample-and-hold circuit. Also, fractional compensation is accomplished dynamically and in a manner that is robust to environmental changes while a control voltage is stably maintained for the voltage controlled oscillator.

33 Claims, 13 Drawing Sheets

SAMPLE AND HOLD TYPE FRACTIONAL-N FREQUENCY SYNTHESIZER

This application claims priority to U.S. Provisional Application Ser. No. 60/276,912, filed Mar. 20, 2001, whose entire disclosure is incorporated herein by reference.

BACKGROUND OF THE INVENTION

1. Field of the Invention

The following invention relates to a method and apparatus for realizing sample and hold type fractional-N synthesizers for use in any system that requires a fractional resolution of a reference frequency, and in particular, to a PLL-based frequency synthesizer for use in communication systems whether wireless or wired.

2. Background of the Related Art

Frequency synthesizers used in modern wireless communication systems typically utilize a Phase Locked Loop (PLL). PLLs usually include a voltage controlled oscillator (VCO), phase detector (PD) and loop filter (LF). To integrate a PLL on a single integrated circuit, a large LF capacitor, which is used to stabilize the PLL, occupies most of the chip area of the circuit because the capacitance needed in the loop filter (LF) is often on the order of several micro-farads. As recent wireless systems are attempting to integrate the overall receiver and transmitter (including the PLL) on a single chip the required capacitance of the LF capacitor is a significant problem.

One related art approach to reduce the LF capacitance is to use a sample-and-hold circuit as a phase detector or comparator. The capacitor in the sample-and-hold circuit has a much smaller capacitance than that in a typical loop filter. The other advantage of a sample-and-hold phase detector is that the output contains no high frequency harmonics of the input frequency. If the phase is constant, the output voltage is also constant. Hence, the sample-and-hold PD is applicable to a frequency synthesizer.

U.S. Pat. No. 6,137,372 discloses a sample-and-hold type PLL frequency synthesizer that does not need a large LF capacitor. The U.S. Pat. No. 6,137,372 sample-and-hold PLL frequency synthesizer uses an integer-N architecture to generate output frequencies that are integer multiples of a reference frequency. However, in the integer-N architecture, the loop bandwidth is limited because the input reference frequency must be equal to the channel spacing. Hence, the attenuation of the close-in phase noise is also limited, because the phase noise of the oscillator is reduced only within the bandwidth of the loop. Another disadvantage of the integer-N architecture is a slow lock time since the lock time of the PLL is also dependent on the loop bandwidth.

To increase the loop bandwidth, fractional-N architectures have been used for frequency synthesizers. In fractional-N synthesizers, the output frequency $F_{OUT}$ can vary by a fraction of the input frequency. Therefore, the input reference frequency can be much greater than the channel spacing and the loop bandwidth is much higher than that of the integer-N synthesizer. In fractional-N synthesizers, however, the phase relationship between the input reference clock and the divided VCO output varies in accordance with the accumulator state. In contrast, the phase relationship is constant in an integer-N synthesizer. Hence, in a conventional fractional-N synthesizer, the sample-and-hold method cannot be realized because the control voltage of the VCO varies in each phase comparison. Moreover, the phase noise and spurious tones that result are above the desired limit and not tolerable in most wireless communication systems.

FIG. 1 illustrates a related art frequency synthesizer using a sample-and-hold circuit. As shown in FIG. 1, the reference frequency divider 104 divides an input reference frequency 102 and produces a divided reference signal 106. The phase detector (PD) 110, receives the divided reference signal 106 and an output 108 of an integer divider 128 and generates an output signal 112 responsive to a comparison thereof. A sample and hold circuit 114 receives the output 112 of the PD 110. A voltage controlled oscillator 118 receives an output 116 of the sample and hold circuit 114. An output 120 of the voltage controlled oscillator 118 is an output signal $F_{OUT}$ of the frequency synthesizer circuit and is also input to the integer divider 128.

In operation, the VCO output signal 120 is divided by N in the integer divider 128 and then compared with the divided reference frequency 106 from the reference divider 104. A phase detector (PD) and the sample-and-hold circuit 130 generates a control signal that is dependent on a detected phase difference. The control signal is applied to the voltage controlled oscillator (VCO), which generates the output frequency $F_{OUT}$.

FIG. 2 is an illustration of the related art phase detector and the sample-and-hold circuit 130. As shown in FIG. 2, a charge pump 206 receives an output 204 of a phase detector 202. An output 214 of the charge pump 206 is received by the sample and hold circuit 114 at an input connected to a first node n1. In the sample and hold circuit 114, a reference voltage $V_{ref}$ 210 is connected to the first node n1 through a first switch 212. A sample capacitor 220 is connected between a ground reference voltage 222 and the first node n1. A second switch 224 is connected between the first node n1 and a second node n2 that is connected to an output terminal 234. A hold capacitor 230 is connected between the ground reference voltage and the second node n2. The capacitance of the sample capacitor 220 and the hold capacitor 230 is much less than that of the typical loop filter. Before phase comparison occurs in the phase detector 202, the switch SW1 is closed and the sample capacitor is charged to the reference voltage $V_{ref}$. The charge pump 206 following the phase detector 202 increases or decreases the voltage of the sample capacitor 220 from the reference voltage $V_{ref}$ according to the detected phase difference in the phase comparison. When the phase comparison is complete, the charge in the sample capacitor 220 is transferred to the hold capacitor 230 via the second switch SW2.

FIG. 3 is a timing diagram of the lock state in a related art sample-and-hold type integer-N frequency synthesizer. As shown in FIG. 3, a relationship between the reference frequency signal 302 and the divider output 304 (i.e., divided VCO output) exists and is a constant phase difference T when the phase is aligned in the typical loop filter type PLL. Hence, the sample-and-hold type PLL is not suitable for application as clock or data recovery where the phase must be aligned between the input reference signal and the VCO output. The phase detector output 306 and voltage of the sample capacitor 308 are also shown in FIG. 3. In the integer-N frequency synthesizer, however, the phase alignment is not a requirement, and the sample-and-hold type PLL is applicable as long as the phase noise characteristic is satisfied. As shown in FIG. 3, it is assumed that the phase of the reference frequency signal 302 leads that of the divider output 304 by the time T, and the phase detector generates an UP (HIGH) signal at every phase comparison to increase the voltage of the sample capacitor (Vsample) at a fixed rate from the reference voltage ($V_{ref}$). Hence, the voltage of the hold capacitor (Vhold) and the output frequency of the voltage controlled oscillator are kept constant.

As described previously, however, an integer-N frequency synthesizer has a narrower loop bandwidth than a fractional-N frequency synthesizer. To increase the loop bandwidth above the channel spacing, the fractional-N synthesizer includes a variable modulus programmable divider, which is controlled by an accumulator. The accumulator changes the division ratio of the variable modulus programmable divider regularly to generate the desired fractional division ratio. Accordingly, the control voltage of the VCO in the fractional-N frequency synthesizer is not constant, but the time-averaged value of the control voltage is meaningful. Thus, the related art fractional-N architecture cannot adopt the sample-and-hold circuit to replace the loop filter.

FIG. 4 is a timing diagram that illustrates problems and disadvantages of a sample-and-hold circuit in the related art fractional-N synthesizer. As shown in FIG. 4, the reference frequency 402 and the divider output 404 do not have a constant aligned phase difference as shown in the phase detector output 306 of FIG. 3. The phase detector output 406, the sample-and-hold circuit output voltage 408 and the state of the fractional accumulator 410 are also shown. In FIG. 4, the fractional ratio is assumed to be 3/8 (K=3 N=8) where N is the division factor. The state of the fractional accumulator varies according to the fractional ratio. Therefore, the phase of the divider output 404 with respect to the reference frequency signal 402 and the width of the UP pulse of the phase detector 406 also vary. The amount of voltage change of the sample capacitor (Vsample) is not fixed and the voltage of the hold capacitor (Vhold) shows fractional ripple which degrades the spectral purity of the synthesized frequency.

The above references are incorporated by reference herein where appropriate for appropriate teachings of additional or alternative details, features and/or technical background.

SUMMARY OF THE INVENTION

An object of the invention is to solve at least the above problems and/or disadvantages and to provide at least the advantages described hereinafter.

Another object of the present invention is to provide a phase locked loop-based fractional-N synthesizer.

Another object of the present invention is to provide a fractional compensation circuit and method that incorporates a sample-and-hold circuit in a loop filter.

Another object of the present invention is to incorporate fractional spur compensation circuitry that dynamically compensates spurious signals.

Another object of the present invention is to provide a phase locked loop-based fractional-N synthesizer and method that uses a plurality of phase detectors to dynamically cancel spurious signals and a sample-and-hold circuit.

Another object of the present invention is to provide a phase locked loop-based fractional-N synthesizer and method that reduces fractional spurs and charge pump ripple whenever the charge pump operates.

Another object of the present invention is to provide a fractional compensation circuit that uses a charge pump stage composed of N charge pumps coupled to a sample-and-hold circuit in a loop filter so that a number of the N charge pumps that operate during a phase comparison is determined by a fractional accumulator stage.

An advantage of a fractional-N architecture and method according to the present invention is that a reference frequency is not restricted by the channel spacing and loop bandwidths can be increased.

Another advantage of a fractional-N architecture and method according to the present invention is that circuit size is reduced.

Another advantage of a fractional-N architecture and method according to the present invention is that the spurious signal cancellation can occur dynamically.

Another advantage of a fractional-N architecture and method according to the present invention is that it avoids the need for a large loop filter capacitor.

Another advantage of a fractional-N architecture and method according to the present invention is that a sample-and-hold circuit can be implemented in the PLL to provide a stable control voltage.

To achieve the above objects in a whole or in part and in accordance with the purpose of the present invention, as embodied and broadly described, there is provided a phase locked loop that includes a first phase detector that receives an input signal and a first divided signal to output a first comparison signal, a second phase detector that receives the input signal and a second divided signal to output a second comparison signal, a sample-and-hold circuit that receives the first and second comparison signals and generates an output signal responsive to the comparison signals, a voltage-controlled oscillator that receives the output signal from the sample-and-hold circuit and generates a prescribed frequency signal, and a modulus divider that receives the prescribed frequency signal and generates the first and second divided signals having a prescribed phase relationship.

To further achieve the above objects in a whole or in part and in accordance with the purpose of the present invention, as embodied and broadly described, there is provided a fractional-N frequency synthesizer for a mobile terminal including a phase detector circuit that includes a first phase detector having a first input port coupled to receive a reference signal, a second input port, a third input port and an output port, and a second phase detector having a first input port coupled to receive the reference signal, a second input port, a third input port and an output port, a sample-and-hold circuit having a first input port coupled to the output ports of the first and second phase detectors and an output port, a voltage-controlled oscillator having an input port coupled to the output port of the sample-and-hold circuit and transmitting a prescribed frequency signal at an output port, a programmable modulus divider having a first output port coupled to the second input port of the first phase detector to transmit a first divided signal, a second output port coupled to the second input port of the second phase detector to transmit a second divided signal, a first input port coupled to the output port of the voltage-controlled oscillator and a second input port, and an accumulator having a first output port coupled to the second input port of the programmable modulus divider and a second output port coupled to the third input ports of the phase detectors.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1:
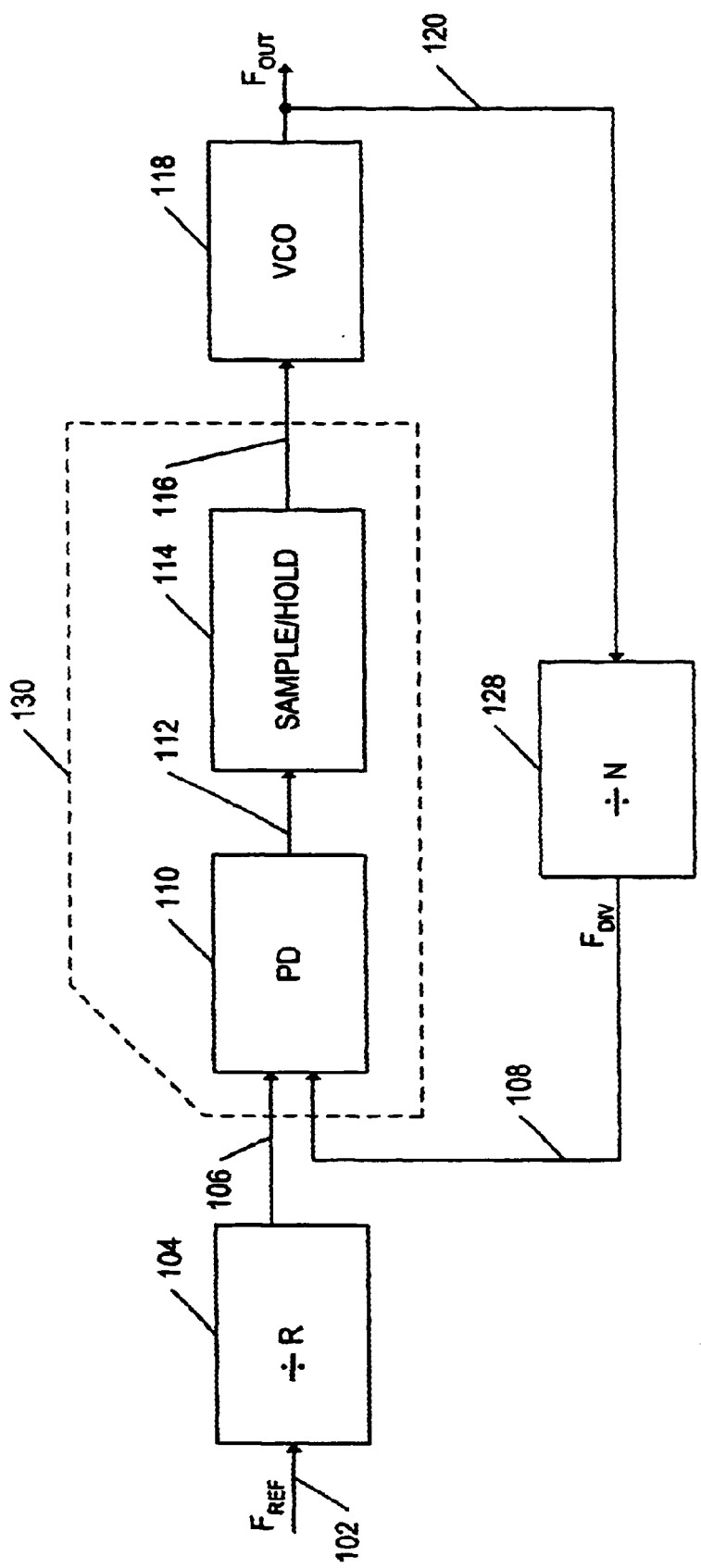
FIG. 1 shows a related art embodiment of a Integer-N frequency synthesizer using a sample-and-hold circuit.
Figure 2:
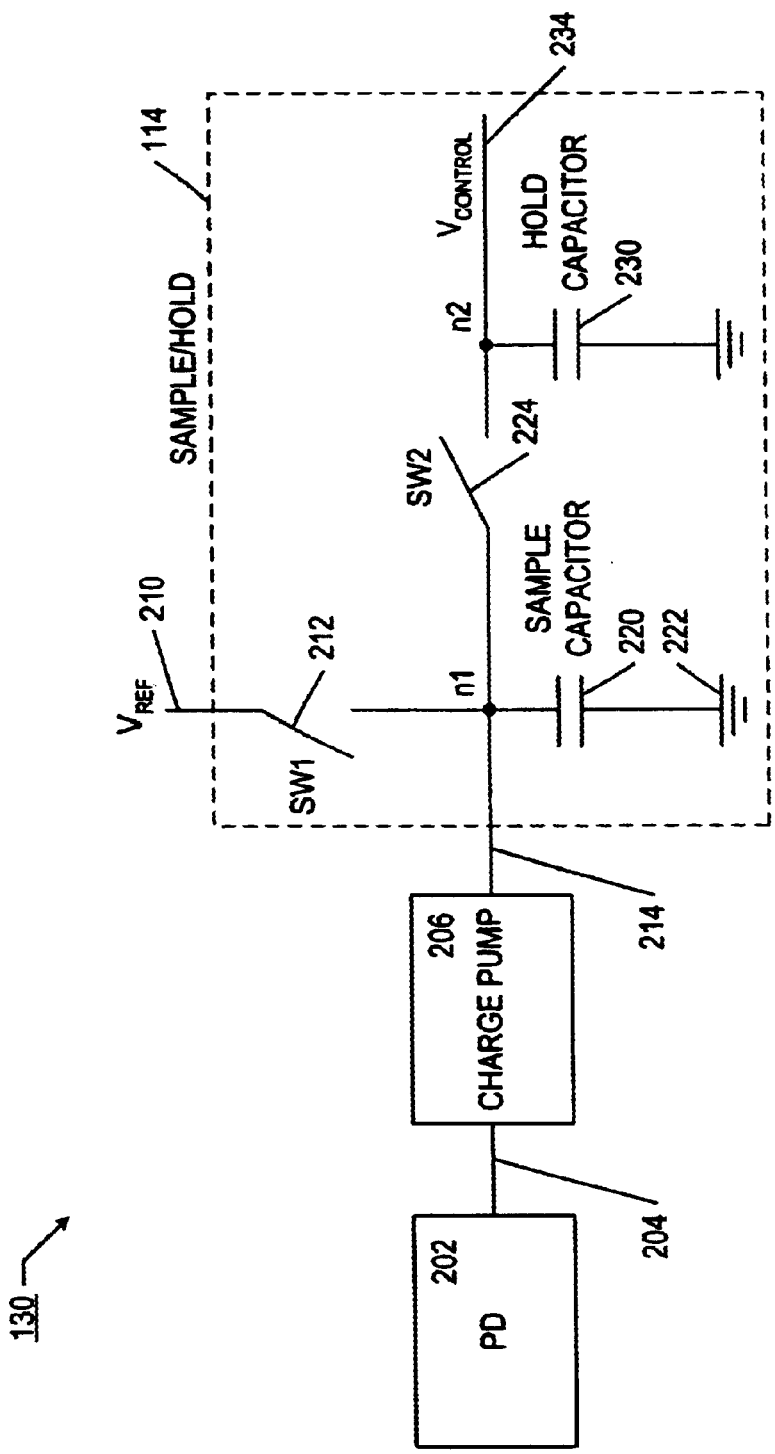
FIG. 2 shows a phase detector and a sample-and-hold circuit of FIG. 1.
Figure 3:
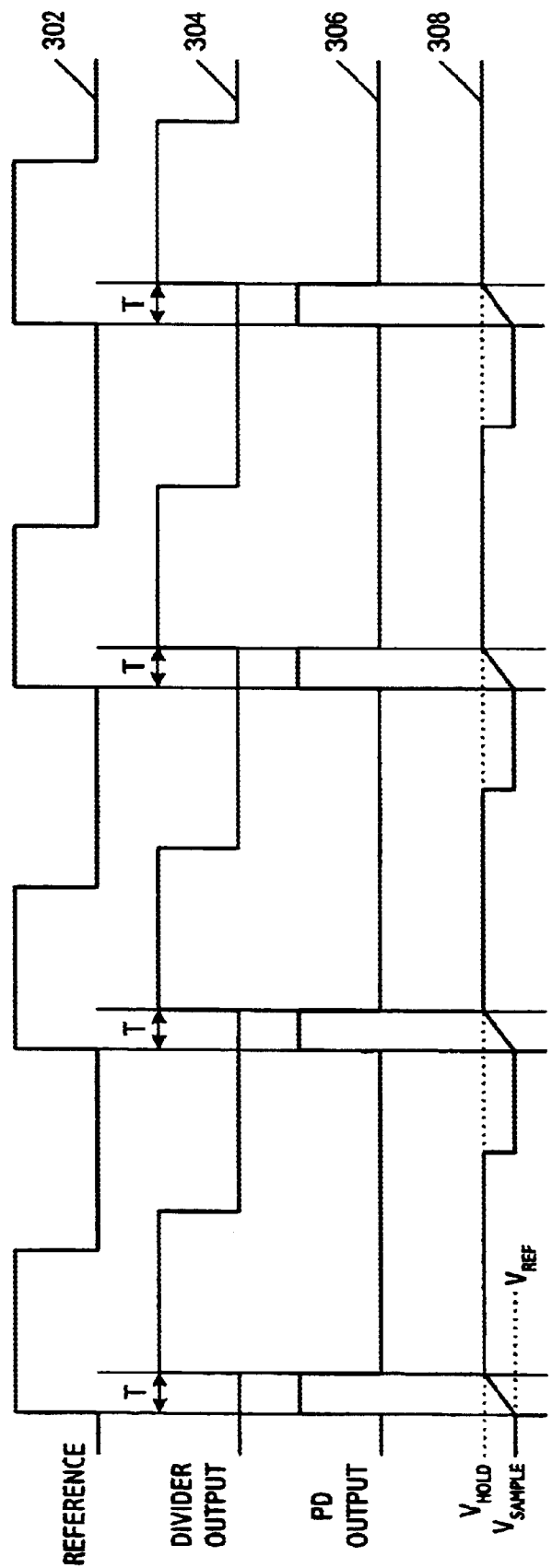
FIG. 3 shows a timing diagram of a lock state in a related art sample-and-hold type integer-N frequency synthesizer.
Figure 4:
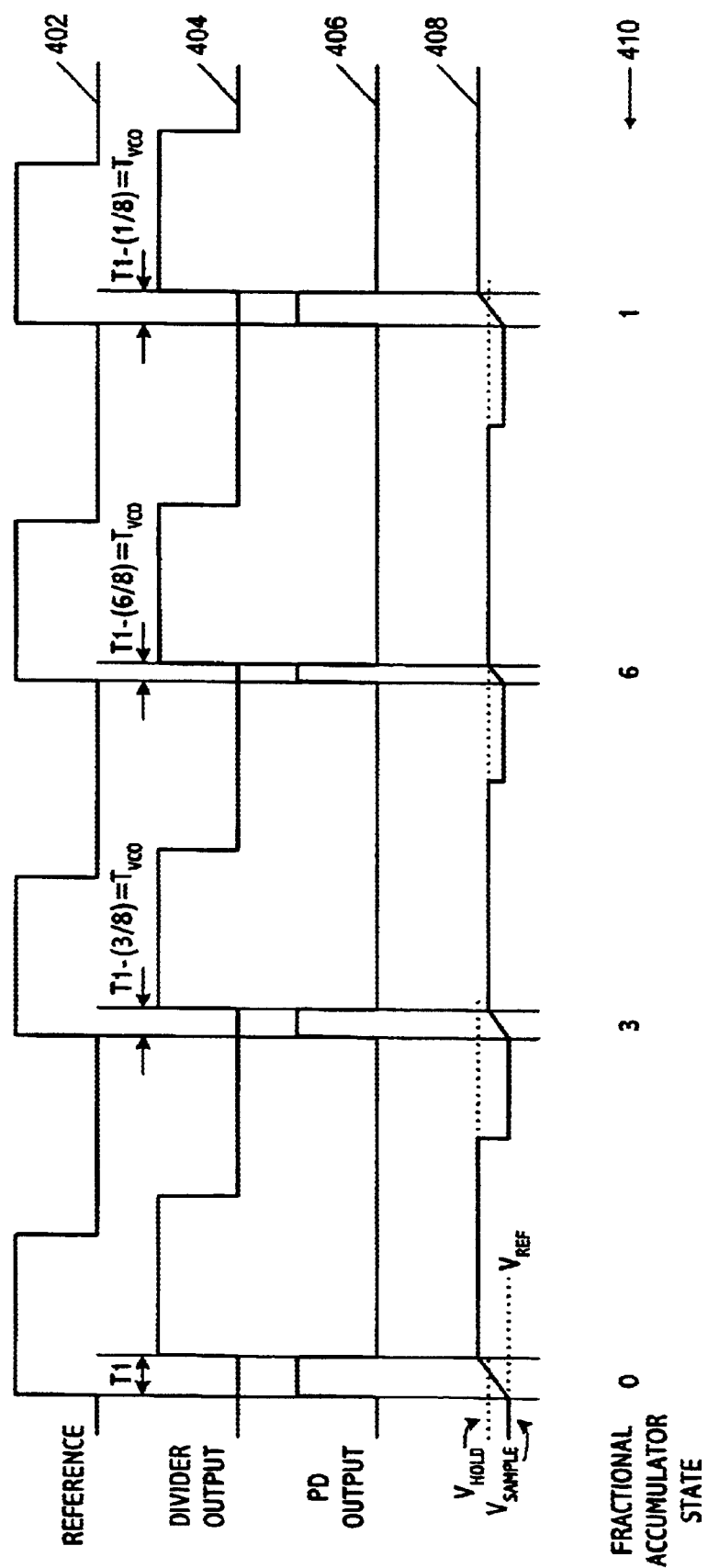
FIG. 4 shows a timing diagram of a sample-and-hold circuit in a related art fractional-N synthesizer.
Figure 5:
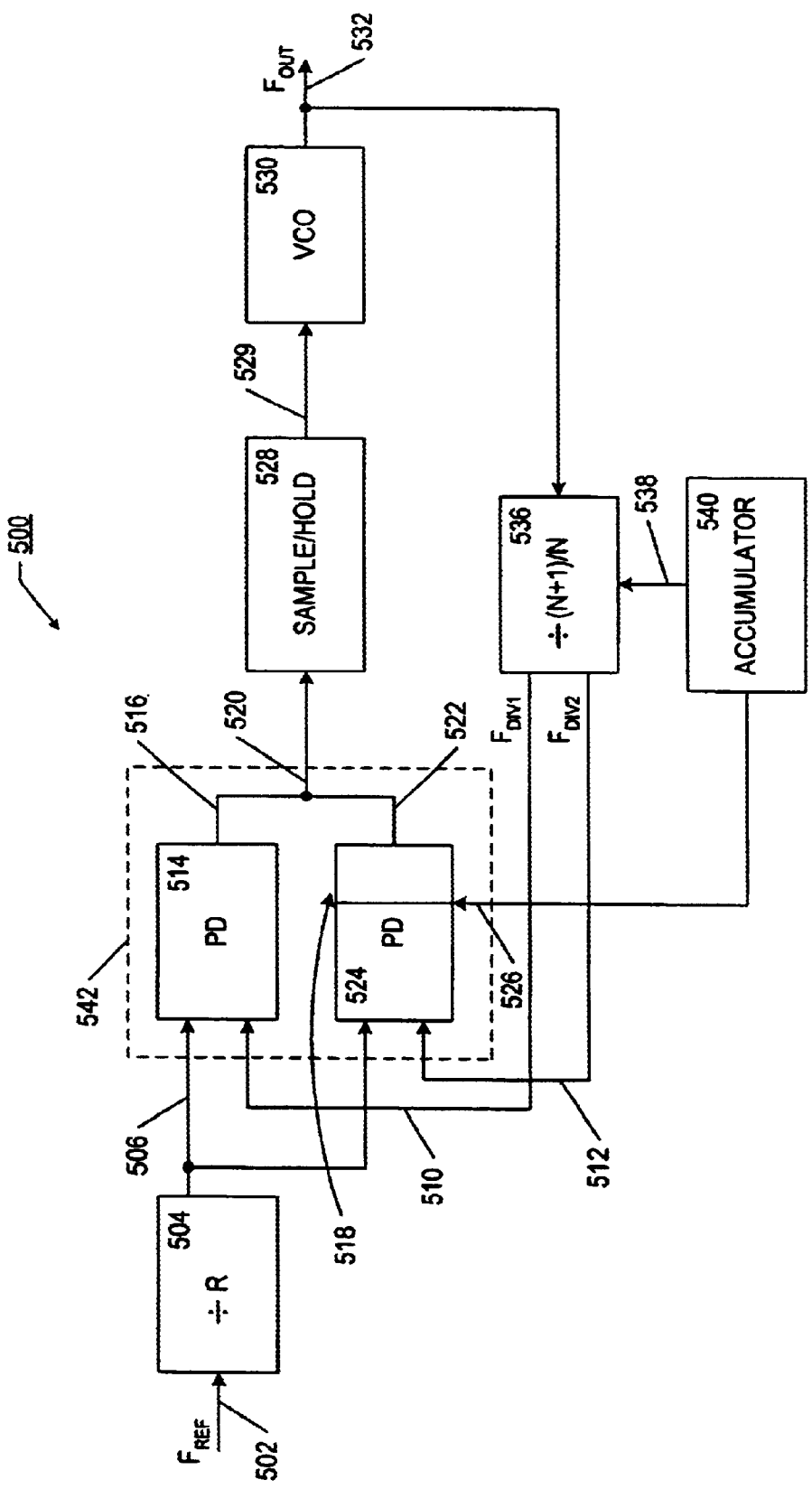
FIG. 5 is a diagram that shows a preferred embodiment of a sample-and-hold type fractional-N frequency synthesizer according to the present invention.

FIG. 5 is a schematic diagram that shows a preferred embodiment of a fractional compensation circuit according to the present invention. As shown in FIG. 5, a frequency synthesizer 500 includes a phase locked loop (PLL) having a phase detector circuit 542, a sample-and-hold circuit 528, a voltage controlled oscillator (VCO) 530, and a programmable modulus divider 536 coupled to an accumulator 540. The frequency synthesizer 500 can preferably reduce or eliminate fractional ripple and implement a sample-and-hold type fractional-N synthesizer having a stable control voltage for a VCO. In the frequency synthesizer 500, a reference frequency 502 is fed into a reference frequency divider 504. The output of the reference frequency divider 504 is branched into two phase detector feeds 506. The two phase detector feeds 506 are respectively input to phase detectors 514 and 524 of the phase detector circuit 542. Outputs 516 and 522, of the phase detectors 514 and 524, are coupled into an input 520 of the sample-and-hold circuit 528. An output 529 of the sample-and-hold circuit 528 is fed into the voltage controlled oscillator (VCO) 530. The phase detector circuit 542 includes the two phase detectors 514 and 524 that preferably contain two charge pump blocks (not shown). The two phase detectors 514 and 524 preferably have a similar construction.

The modulus programmable divider 536 divides an output frequency signal $F_{OUT}$ 532 of the VCO 530, alternatively by N and N+1, respectively, depending on the control signal 538 from the accumulator 540. Each of the two divided VCO signals $F_{DIV1}$ and $F_{DIV2}$ from the modulus programmable divider 536 serve as second inputs 510 and 512, respectively, of the phase detectors 514 and 524. The two divided VCO signals $F_{DIV1}$ and $F_{DIV2}$ 510 and 512 produced by the modulus programmable divider 536 preferably have the same frequency and a phase difference that is a period of the VCO output ($T_{VCO}=1/F_{OUT}$). N equal charge pumps (not shown) are preferably coupled to each phase detector 514 and 524. The accumulator 540, controls the number of charge pumps to be enabled before the phase comparison in the phase detectors 514 and 524 between the input reference frequency ($F_{REF}$) and the divided VCO clock ($F_{DIV1}$, $F_{DIV2}$) occurs. Thus, the accumulator 540 outputs enable signals 518 and 526, respectively, to the phase detectors 514 and 524.

Figure 6:
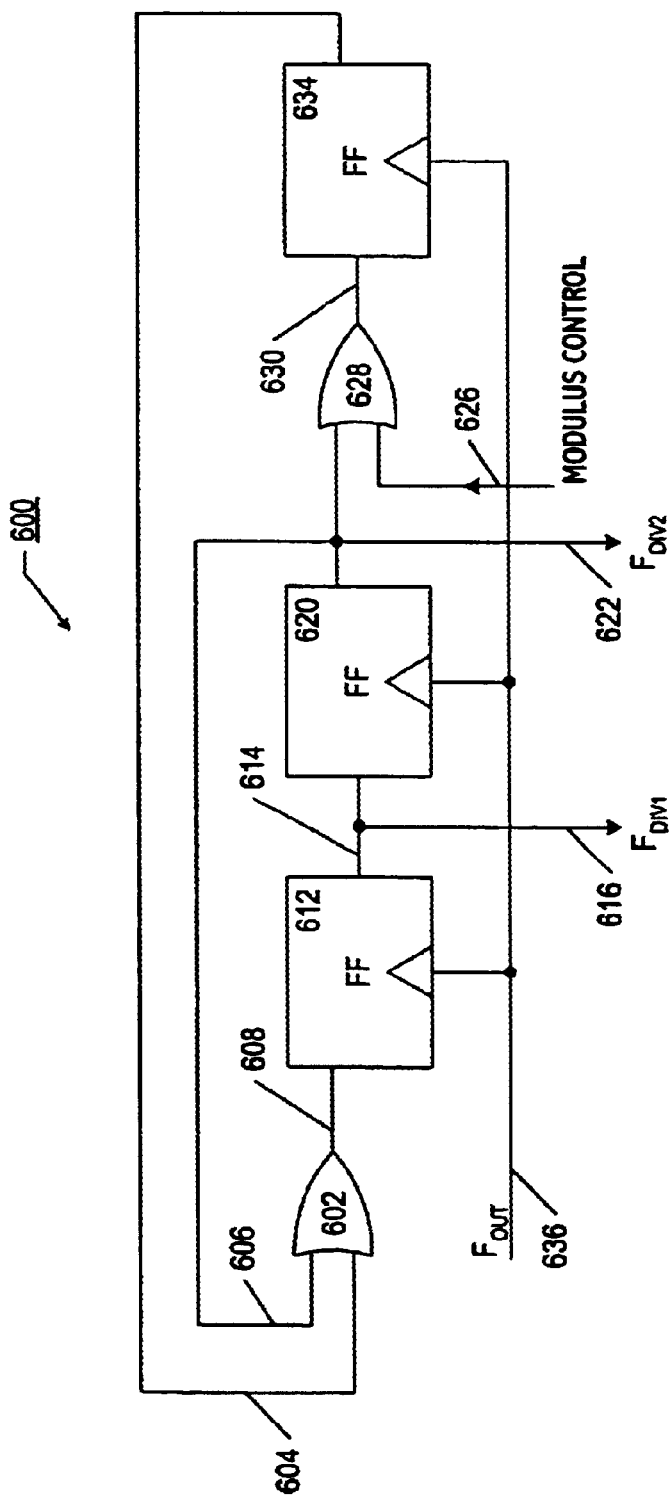
FIG. 6 is a diagram that shows a preferred embodiment of a modulus divider of FIG. 5.

FIG. 6 is a diagram that shows a preferred embodiment of a programmable modulus divider 600, (e.g., dividing an input signal by N+1 or by N), which produces two divided VCO outputs $F_{DIV1}$ and $F_{DIV2}$, 616 and 622. The programmable modulus divider 600 can be used, for example, as the programmable modulus divider 536 of FIG. 5. The programmable modulus divider 600 can include three flip flops 612, 620, 634 and two logic gates 602, 628. Since the three flip-flops 612, 620 and 634, are preferably clocked by an identical output signal 636, which is preferably the output frequency signal (e.g., $F_{OUT}$ 532), the phase difference between $F_{DIV1}$ and $F_{DIV2}$, 616 and 622, is a period of a VCO frequency ($T_{VCO}=1/F_{OUT}$).

As shown in FIG. 6, a first OR gate 602 receives an input 604 from the third flip-flop 634 and receives an input 606 from the second flip-flop 620. The first flip-flop 612 receives and processes an output 608 of the first OR gate 602 according to the $F_{OUT}$ signal 636. The second flip-flop 620 receives and processes an output 614 from the first flip-flop 612 according to the $F_{OUT}$ signal 636. In addition to the input 606 from the second flip-flop 620, the second OR gate 628 receives a modulus control signal as an input 626. The third flip-flop 634 receives and processes an output 630 from the second OR gate 628 according to the $F_{OUT}$ signal 636. The output signals 614 and 606 of the first and second flip flop 612, 620 are preferably the divided VCO signals $F_{DIV1}$ 616 and $F_{DIV2}$ 622 from the programmable modulus divider 600.

Figure 7:
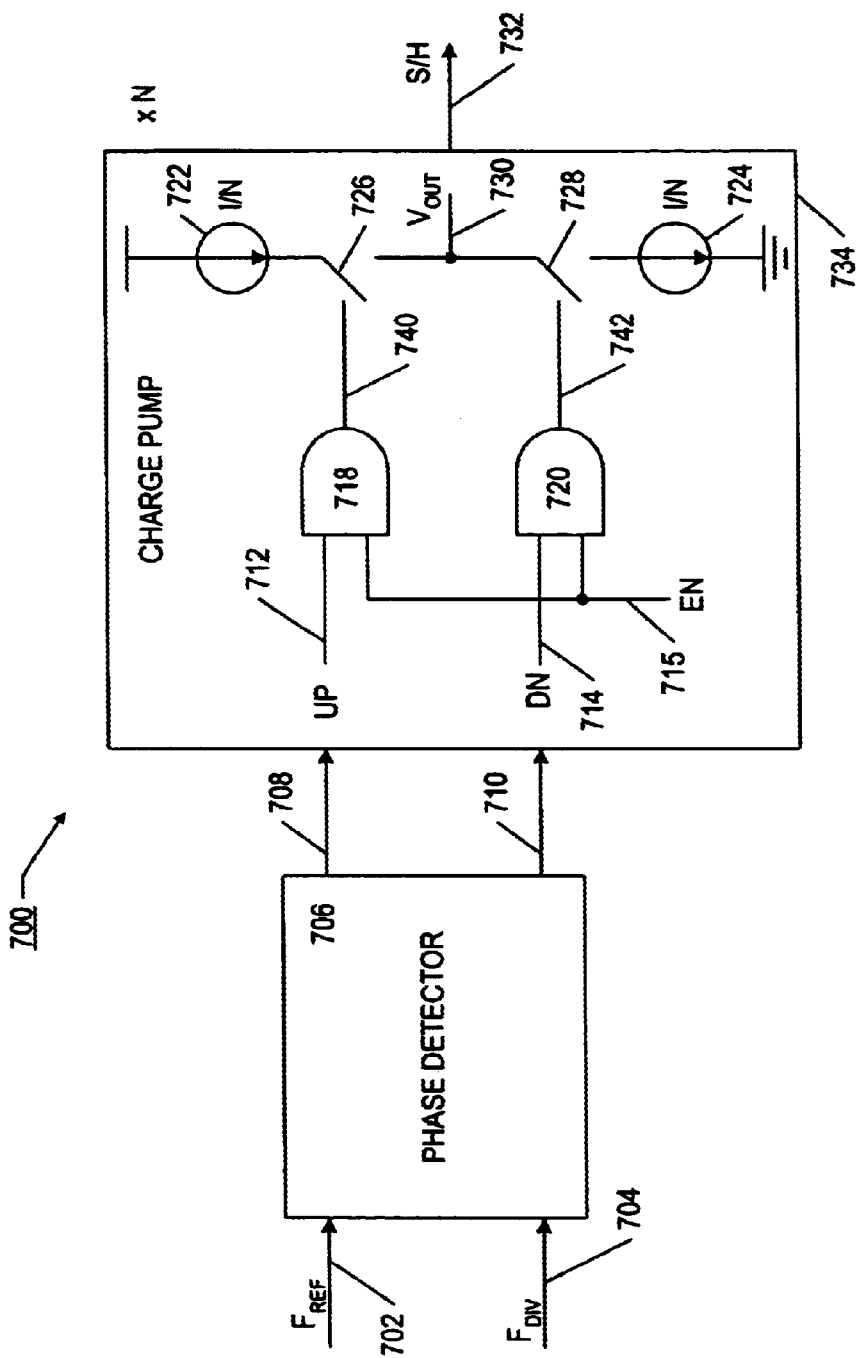
FIG. 7 is a diagram that shows a preferred embodiment of a phase detector and charge pump circuit having each phase detector coupled to N charge pumps.

FIG. 7 is a diagram that shows a preferred embodiment of a phase detector and charge pump circuit 700. As shown in FIG. 7, the phase detector and charge pump circuit 700 can be used, for example, as one of the phase detectors 514, 524 in the phase detector circuit 542 shown in FIG. 5. The charging or discharging current provided from each charge pump to the sample-and-hold circuit (not shown) is preferably determined as I/N, where I is the current of a typical fractional-N frequency synthesizer. An enable signal (EN) 715, is generated by a corresponding accumulator (not shown) such as the accumulator 540 according to the fractional accumulator state, and controls whether the charge pump 734 is enabled. As shown in FIG. 7, there are preferably N charge pumps 734 coupled to the phase detector 706 that receive at least one enable signal from an accumulator.

As shown in FIG. 7, a phase detector 706 compares an $F_{REF}$ input 702 as a divided reference frequency, and an $F_{DIV}$ input 704 to generate two outputs 708 and 710, each received by a charge pump circuit 734, responsive to the comparison. A first AND gate 718 of the charge pump 734 receives an "UP" signal 712 and the EN signal 715. A second AND gate 720, receives a DN signal 714, and the EN signal 715. A first switch 726 and a first current source 722 are coupled in series between a power supply voltage and an output terminal 730. The state of the first switch 726 (e.g., open or closed) is controlled by an output signal 740 from the first AND gate 718 responsive to the comparison in the corresponding phase detector and the enable signal EN. A second switch 728 and a second current source 724 are coupled in series between the output terminal 730 and a ground reference voltage. The state of the second switch 728 is preferably controlled by an output signal 742 from the second AND gate 720. Thus, the first current source 722 and the second current source 724, are selectively coupled into the single output terminal 730 of the charge pump 734. An output 732 of the N charge pumps (734-1, ..., 734-N) of phase detector and charge pump circuit 700 is received by the sample-and-hold circuit (not shown). Output terminals 730 of the N charge pumps 734 are coupled to provide the output 732 to the sample-and-hold circuit (not shown). However, the present invention is not intended to be so limited.

Figure 8:
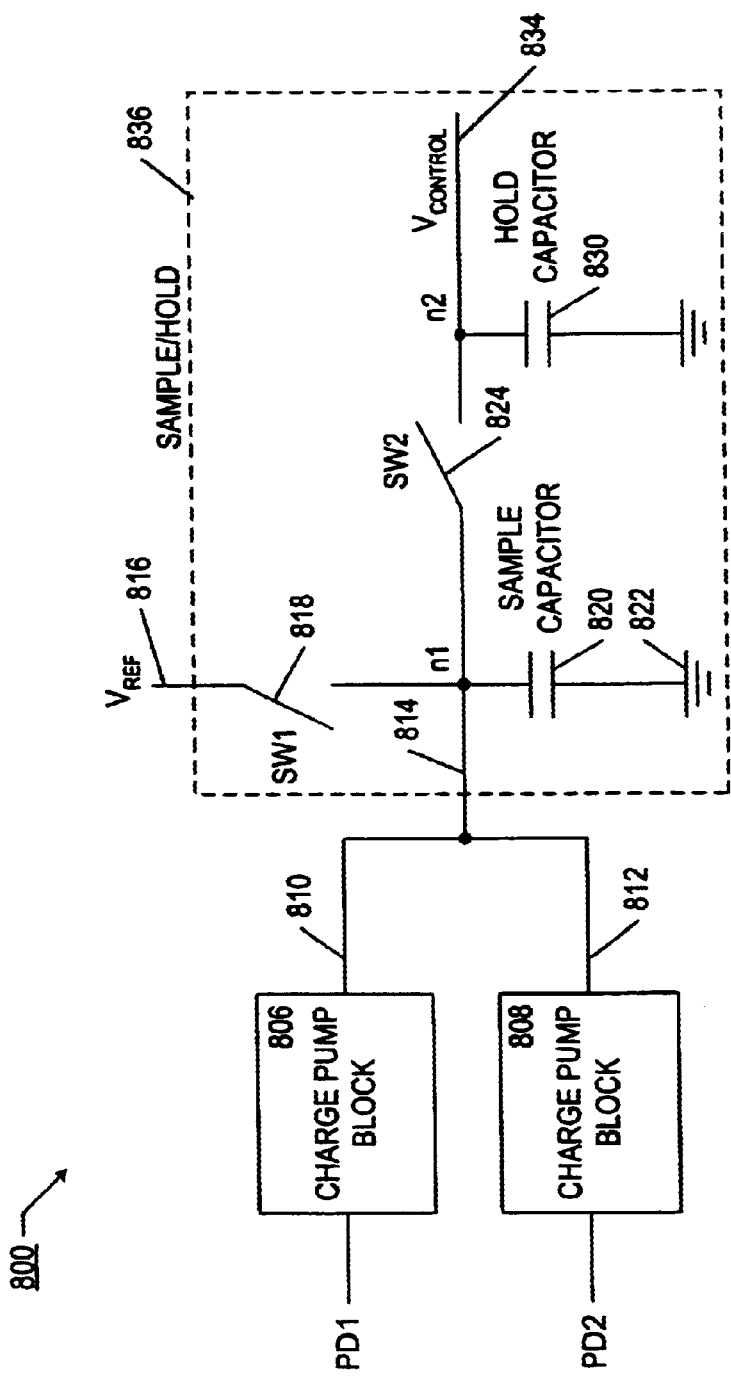
FIG. 8 is a diagram that shows a sample-and-hold circuit of FIG. 5 where each charge pump output is coupled to one sample capacitor.

FIG. 8 is a diagram that illustrates a preferred embodiment of a sample-and-hold circuit 800 where a plurality of phase detectors are respectively coupled to one sample capacitor. As shown in FIG. 8, a first charge pump 806 receives an input from a first phase detector PD1, and a second charge pump 808 receives an input from a second phase detector PD2. An output 810 of the first charge pump 806 and an output 812 of the second charge pump 808 are coupled together to an input 814 of a sample-and-hold circuit 836 that is coupled to a first node n1. In the sample and hold circuit 836, a reference voltage $V_{ref}$ 816 is coupled to the first node n1 through a first switch 818. A first capacitor 820, a sample capacitor, is coupled between a ground reference voltage 822 and the first node n1. A second switch 824 is coupled between the first node n1 and a second node n2 that is coupled to an output terminal 834. A second capacitor 830, a hold capacitor, is coupled between the ground reference voltage 822 and the second node n2. The capacitance of the sample capacitor 820 and the hold capacitor 830 is much less than that of the typical loop filter capacitor. Before phase comparison occurs in the phase detectors PD1 and PD2, the first switch 818 is closed and the sample capacitor 820 is charged to the reference voltage $V_{ref}$ 816. The charge pump blocks 806 and 808 respectively following the phase detectors PD1 and PD2 increase or decrease the voltage of the sample capacitor 820 from the reference voltage $V_{ref}$ 816 according to the detected phase difference in the phase comparison. When the phase comparison is complete, the charge in the sample capacitor 820 is preferably transferred to the hold capacitor 830 via the second switch 824.

Figure 9:
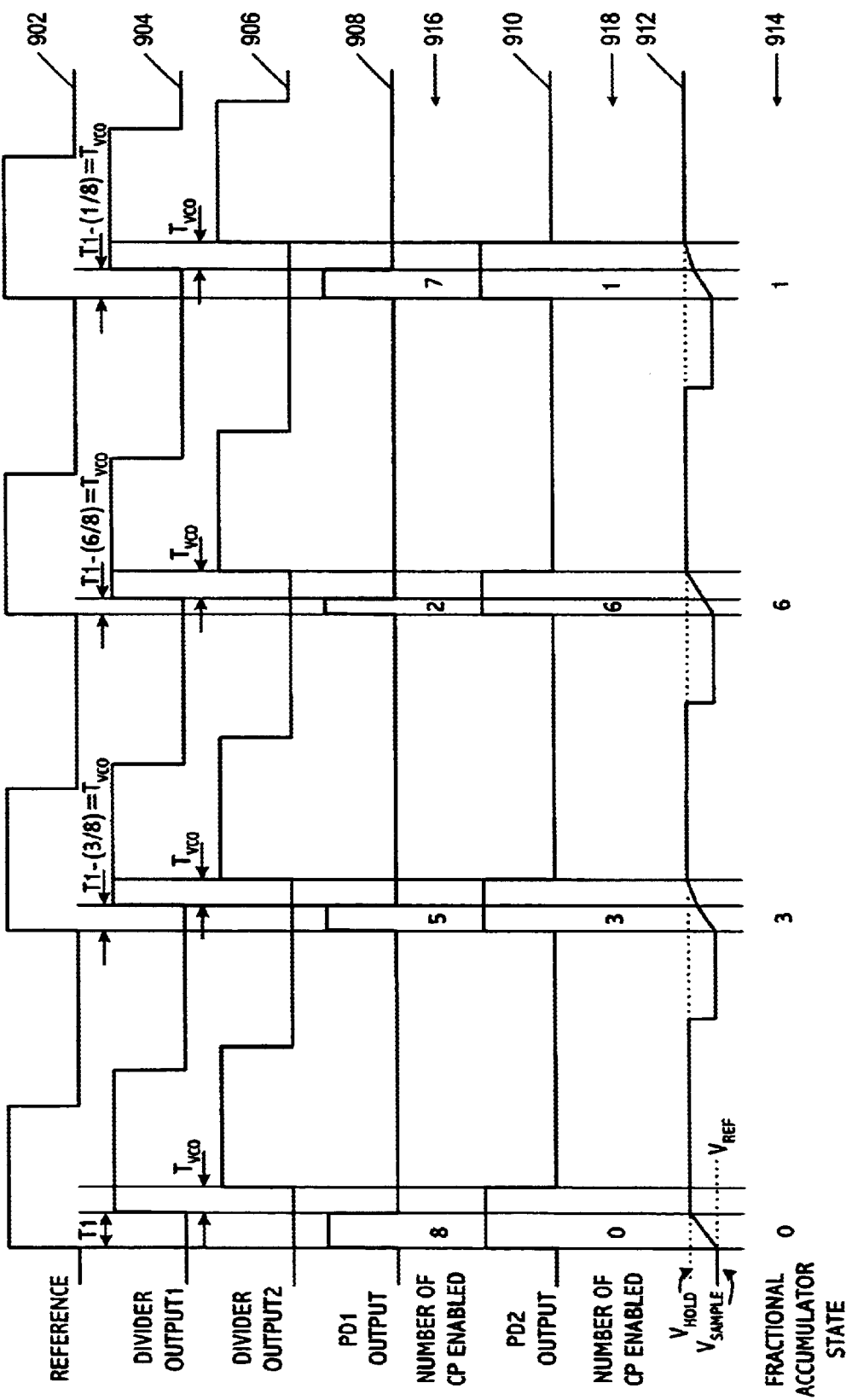
FIG. 9 is a timing diagram that illustrates a preferred embodiment of a method of operating a sample-and-hold fractional-N frequency synthesizer according to the invention.

FIG. 9 is a timing diagram that shows fractional compensation method of a sample-and-hold type fractional-N frequency synthesizer according to the present invention. For example, FIG. 9 can show a phase relationship between the divided reference frequency 506 and the divided VCO frequencies 510, 512 of the frequency synthesizer 500 of FIG. 5. In FIG. 9, it is assumed that the fractional number is 3/8 (K=3, N=8). The fractional accumulator state K determines the number of charge pumps that operate during the phase comparison. For example, (N−K) charge pumps of PD1 and K charge pumps of PD2 are enabled. The total number of charge pumps enabled is always N. In FIG. 9, the relative voltage waveforms of the divided reference frequency 902, the Divider Output1 904, the Divider Output2 906, the PD1 output 908, the PD2 output 910, and the control voltage 912 are shown. The number of enabled charge pumps 916 and 918, and the fractional accumulator state 914, are also indicated relative to the waveforms. In FIG. 9, a phase lead of the divided reference signal 902 is uniformly compensated by varying the number of enabled charge pumps corresponding to PD1 and PD2 so that charging increases from PD1 and PD2 to the control voltage (Vhold) from the reference voltage (Vsample) combine to a consistent value.

Figure 10:
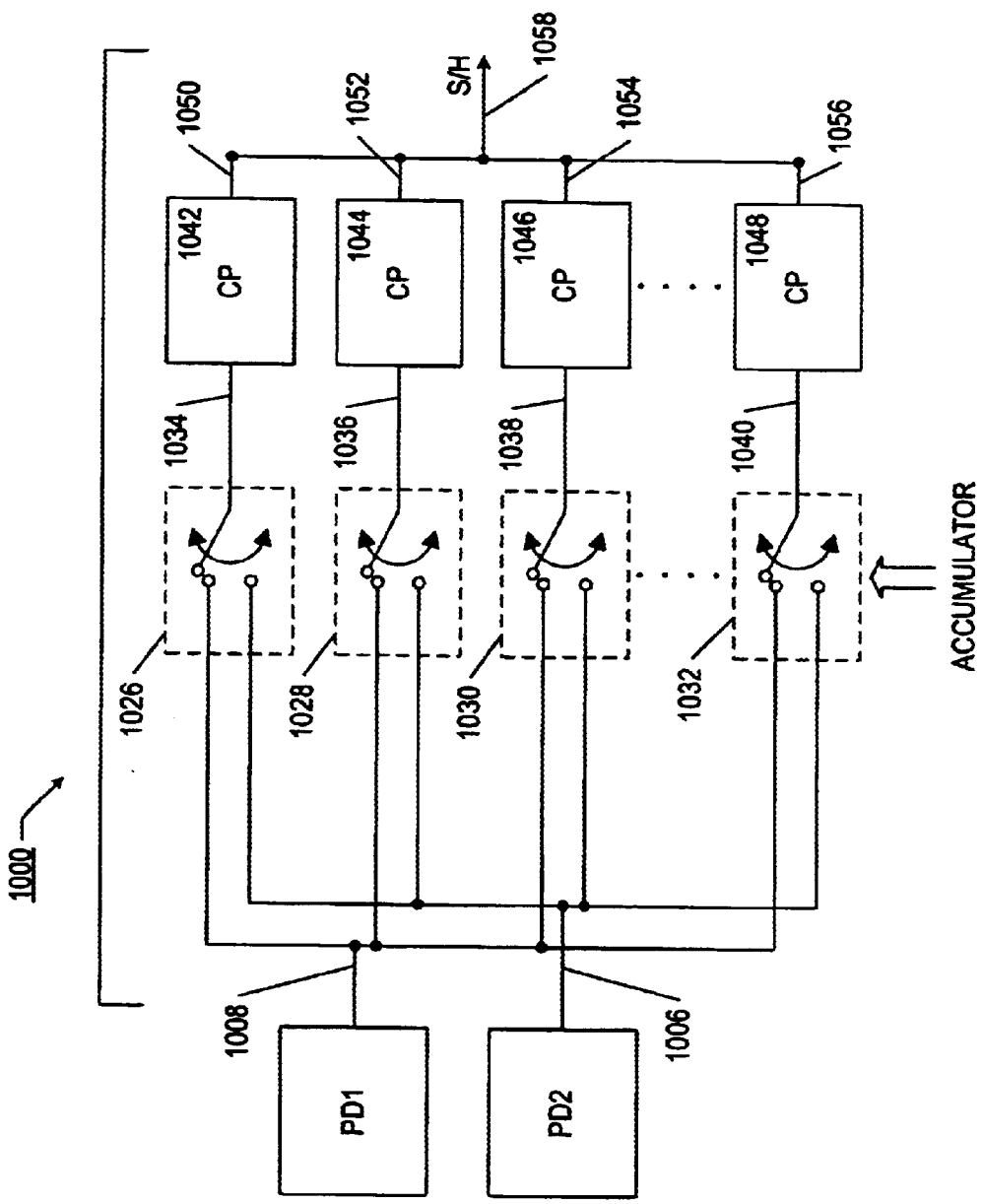
FIG. 10 is a diagram that shows another preferred embodiment of a phase detector and charge pump circuit including a charge pump block having a reduced number of charge pumps.

Another preferred embodiment of a phase detector circuit including a charge block pump with a total of N charge pumps is illustrated in FIG. 10. As shown in FIG. 10, a charge pump block 1000 receives an output 1008 of the first phase detector PD1, which serves as a series of first inputs to switches 1026, 1028, 1030, ..., 1032, respectively. The output 1006 of the second phase detector PD2 serves as a series of second inputs to the switches 1026, 1028, 1030, ..., 1032, respectively. Respective switch outputs 1034, 1036, 1038 ..., 1040, of the switches 1026, 1028, 1030 and 1032 serve as inputs to the charge pumps 1042, 1044, 1046 ..., 1048. Outputs 1050, 1052, 1054, ..., 1056 of the preferably N charge pumps 1042, 1044, 1046 ..., 1048, are coupled into an output signal 1058 to be connected to the sample-and-hold circuit (not shown). In the charge pump block 1000 as shown in FIG. 10, the number of charge pumps is reduced to N, compared to a total of 2N charge pumps of FIG. 7, since the accumulator controls the coupling of the phase detectors PD1 and PD2 to the charge pumps 1042, 1044, 1046, ..., 1048.

As described above with respect to FIG. 10, a total of N charge pumps are implemented and a switch controlled by an accumulator preferably determines the number of charge pumps connected to PD1 and PD2. As shown in FIG. 9, an amount of charge sourced from the charge pump at every phase comparison is given by the equation:

$$Q_{TOTAL} = I_{CP1}*T_{CP1} + I_{CP2}*T_{CP2}$$

$$= [\{(N-K)*(I/N)\}*\{T1-(K/N)*T_{VCO}\}] + [K*(I/N)*\{(T_1-(K/N)*T_{VCO}) + T_{VCO}\}]$$

$$= I*T_1 = \text{constant} \quad \text{(Eq. 1)}$$

Therefore, the voltage change of the control voltage or the sample capacitor is constant and the voltage of the hold capacitor is also kept constant. Consequently, the synthesized output shows a good spectral purity. If the division ratio changes to generate a different frequency, the phase difference $T_1$ between the reference signal and the divided output changes, which determines the control voltage. Further, as shown in FIG. 9, the reference signal leads the divided signals 904 and 906. However, the present invention is not intended to be so limited. If the phase of the reference signal lags that of the divided output, the voltage of the sample capacitor can be lowered from the reference voltage $V_{ref}$. In addition, preferred embodiments according to the present invention can be implemented in a variety of manners by changing the phase difference of the two divider output signals and the number of charge pumps in each phase detector.

Figure 11:
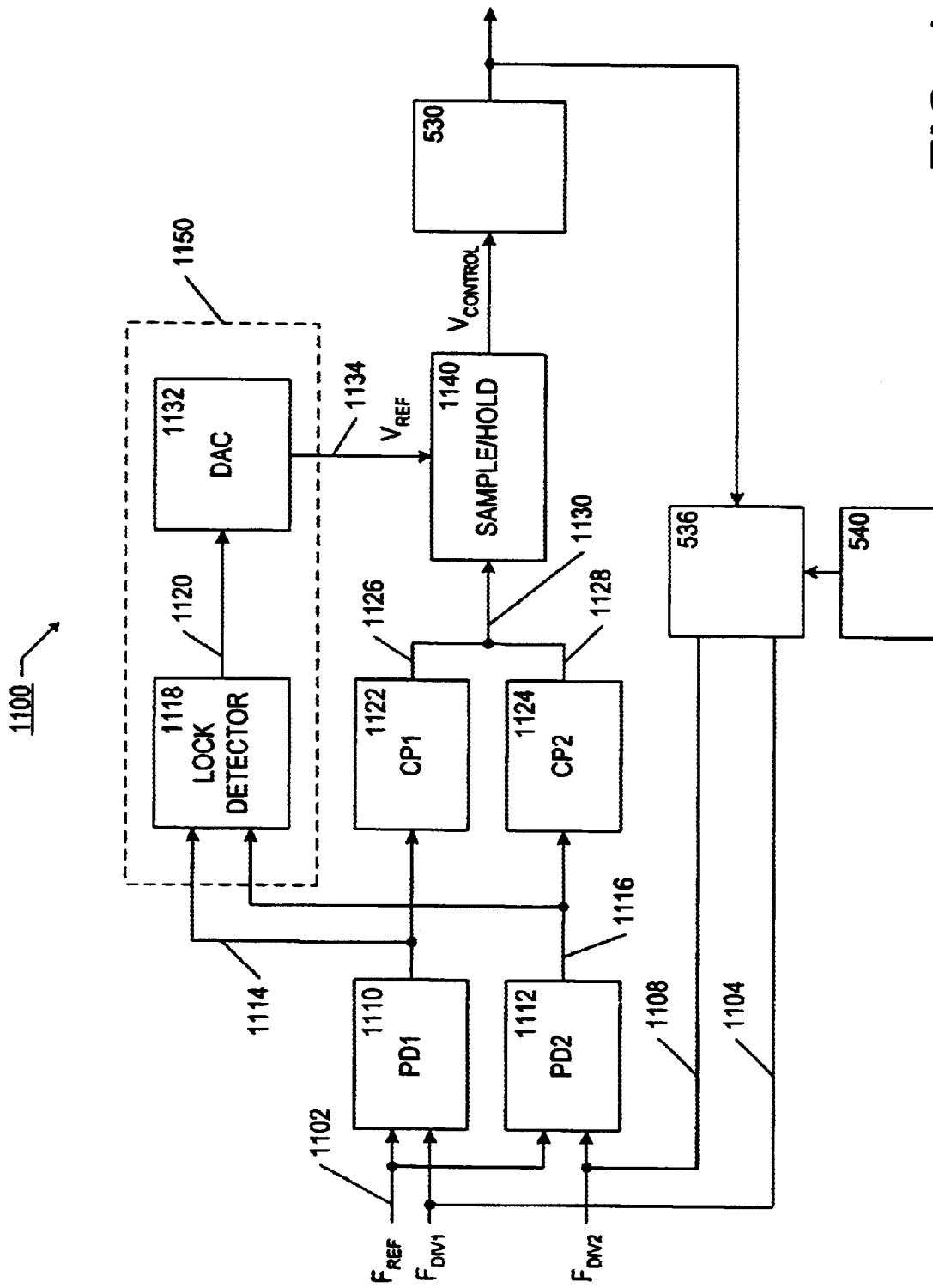
FIG. 11 is a diagram that shows another preferred embodiment of a sample-and-hold type fractional-N frequency synthesizer including a detector circuit to set a reference voltage according to the present invention.

Another embodiment of a sample-and-hold type fraction-N frequency synthesizer including a phase locked loop according to the present invention is illustrated in FIG. 11. As shown in FIG. 11, a frequency synthesizer 1100 receives a reference frequency 1102 that is input to a first and second phase detector 1110 and 1112, respectively. The first phase detector 1110 also receives a first divided VCO frequency 1104, and the second phase detector 1112 also receives a second divided VCO frequency 1108. A lock detector 1118 and a first charge pump block 1122 receives an output 1114 of the first phase detector 1110. The lock detector 1118 and a second charge pump 1124 receive an output 1116 of the second phase detector 1112. An output 1126 of the first charge pump 1122 and an output 1128 of the second charge pump 1124 are coupled together and serve as an input 1130 to a sample-and-hold circuit 1140 such as the sample-and-hold circuit 528. Preferably, the VCO 530, the modulus programmable divider 536 and the accumulator 540 or the like are coupled to the sample-and-hold circuit 1140 and the phase detectors 1110 and 1112.

In the preferred embodiment of FIG. 11, a Digital to Analog Converter (DAC) 1132 receives an input 1120 from the lock detector 1118, and produces an output 1134 received by the sample-and-hold circuit 1140. Preferably, the output 1134 is a reference voltage $V_{ref}$ used to initialize the sample capacitor.

In a sample-and-hold type PLL, if the reference voltage is initially set too far from the locking control voltage, the loop may not generate the desired frequency. The frequency synthesizer 1100 according to the present invention includes a lock detector so that the loop will generate the desired frequency even when the reference voltage is initially set too far from the locking control voltage. As shown in FIG. 11, a detector circuit 1150 can include the lock detector 1118 and the DAC 1120. The lock detector 118 respectively preferably monitors the output of each phase detector 1110 and 1112. For example, when both outputs of PD1 and PD2 are increase voltage signals (e.g., "UP" signals), the reference signal 1102 leads the divided signals 1104 and 1108. In this case, the DAC 1132 increases the reference voltage 1134 (e.g., $V_{ref}$) to minimize the voltage difference between the reference voltage and the desired voltage. When both outputs of PD1 and PD2 are decrease voltage signals (e.g., "DOWN" signals), the reference signal 1102 is lagging the divided signals 1104 and 1108. In this case, the DAC 1132 decreases the reference voltage 1134. In the case where one phase detector generates an increase signal and another phase detector generates a decrease signal (e.g., where PD1 generates a DOWN signal and PD2 generates an UP signal), the reference voltage 1134 is very close to the desired control voltage. However, the present invention is not intended to be so limited.

Figure 12:
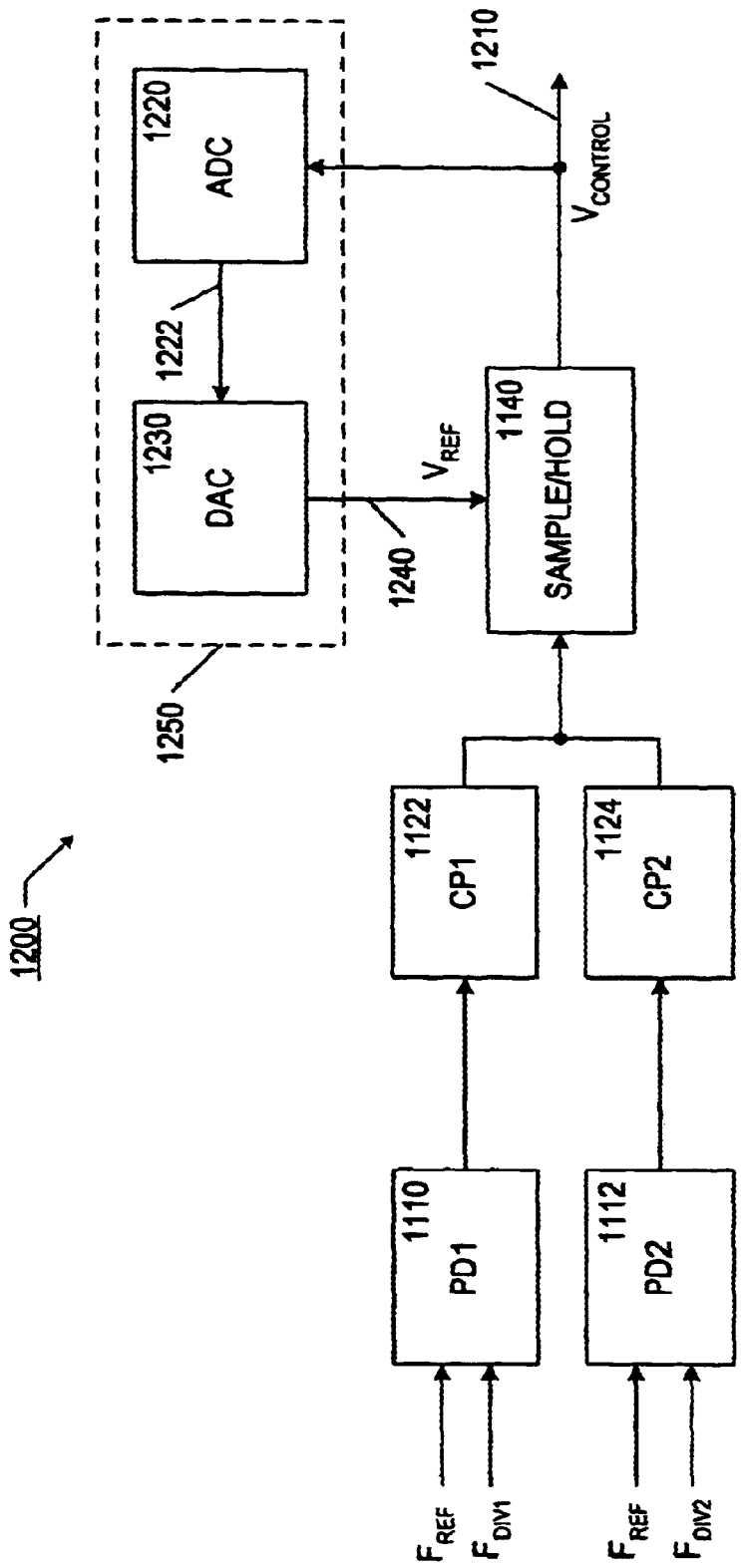
FIG. 12 is a diagram that shows a portion of another preferred embodiment of a fractional-N synthesizer including a detector circuit to set a reference voltage according to the present invention.

FIG. 12 illustrates a system for setting the reference voltage according to another embodiment of the invention. As shown in FIG. 12, another preferred embodiment of a detector circuit 1250 includes an analog-to-digital circuit (ADC) 1220 and a digital-to-analog circuit (DAC) 1230. The first phase detector 1110, the second phase detector 1112, the first charge pump 1122, the second charge pump 1124 and the sample-and-hold circuit 1140 are described above. Accordingly, a description is omitted here. An output 1210 of the sample and hold circuit 1140, is transmitted to a VCO (not shown) and to the analog to digital converter 1220. An output 1222 of the analog to digital converter 1220 is received by the digital to analog converter 1230. The ADC 1220 determines the control voltage for comparison to a prescribed voltage and preferably sets the reference voltage 1240 (e.g., $V_{ref}$) through the DAC 1230. However, the present invention is not intended to be so limited. For example, the detector circuit 1250 can also be replaced with the detector circuit 1150 where the DAC 1132 output is controlled until it is comparable to a prescribed control voltage using the lock detector 1118 that receives the output voltage 1210 from the sample-and-hold circuit 1140.

Figure 13:
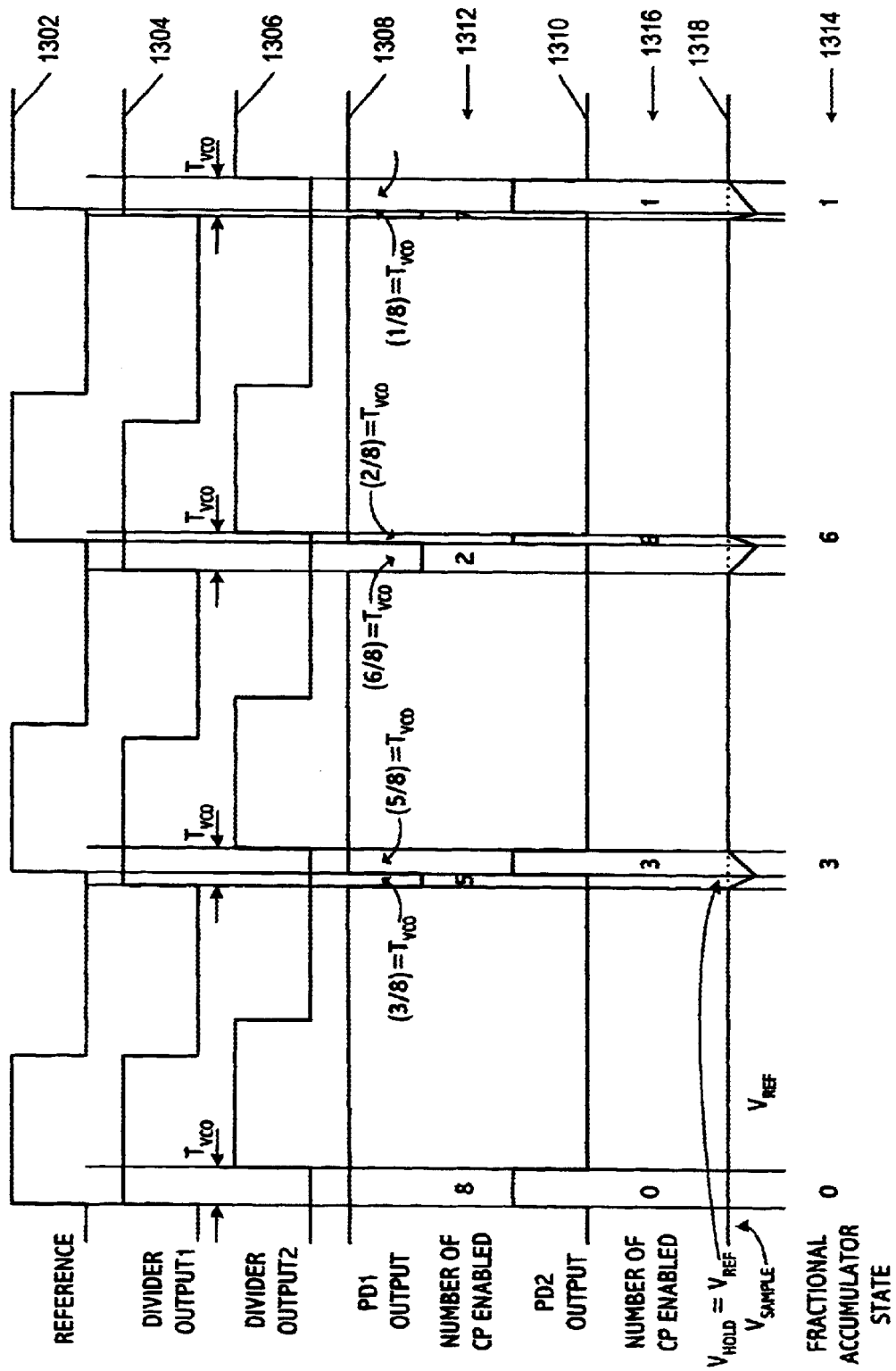
FIG. 13 is a timing diagram that shows another preferred embodiment of a method of operating a sample-and-hold type fractional-N frequency synthesizer when the reference voltage is matched with the desired control voltage according to the present invention.

FIG. 13 illustrates a timing diagram that shows fractional compensation method of a sample-and-hold type fractional-N frequency synthesizer when the reference voltage in the sample-and-hold circuit is matched with the desired control voltage. For example, FIG. 13 can show can show a phase relationship between the divided reference frequency 506 and the divided VCO frequencies 510, 512 of the frequency synthesizer 500 of FIG. 5. In FIG. 13, it is assumed that the fractional number is ⅜ (K=3, N=8) as described above. The relative voltage waveforms are the divided reference frequency 1302, the Divider Output1 1304, the Divider Output2 1306, the PD1 output 1308, the PD2 output 1310, and the control voltage 1318 are shown. The number of enabled charge pumps 1312 and 1316, and the fractional accumulator state 914, are also indicated relative to the waveforms.

As shown in FIG. 13, the reference signal is between the divided signals. Thus, the charge pumps (CP1) coupled to PD1 always sink current from the sample-and-hold circuit while those (CP2) coupled to PD2 always source current to the sample-and-hold circuit of the frequency synthesizer. The amount of charging and discharging is accurately matched through Equation 1 and the control voltage is kept constant. According to Equation 1, the amount of discharging current by the CP1 is given by the equation:

$$Q_{discharge}=I_{discharge}*T_{discharge}=\{(N-K)*(I/N)\}*\{(K/N)*T_{VCO}\} \quad \text{(Eq. 2)}$$

where K represents the accumulator state. Similar to Eq. 2, the amount of charging current by the CP2 is given by the equation:

$$Q_{charge}=I_{charge}*T_{charge}=\{K*(I/N)\}*[\{(N-K)/N\}*T_{VCO}] \quad \text{(Eq. 3)}$$

From (Eq. 2) and (Eq. 3), $Q_{charge}$ and $Q_{discharge}$ are always the same.

As described above, preferred embodiments of a frequency synthesizer according to the present invention have various advantages. Preferred embodiments of a phase-locked loop (PLL) frequency synthesizer incorporate a sample-and-hold circuit in a fractional-N type synthesizer. The preferred embodiments reduce a circuit size and power requirements because a sample-and-hold circuit replaces a related art loop-filter capacitor in a fractional-N type frequency synthesizer. A frequency synthesizer including a phase-locked loop (PLL) according to the preferred embodiments also incorporates fractional spur compensation circuitry to dynamically compensate charge pump ripple whenever a charge pump operates. In the preferred embodiments, a programmable divider produces two output signals that are preferably divided signals from a voltage controlled oscillator (VCO) with a phase difference being a period of the VCO output. In a locked state of a frequency synthesizer, the phase of the corresponding reference signals occurs between the two divider signals. In a preferred embodiment, two phase detectors (PD) are used each receiving the reference signal and one of the two divided VCO signals so that one phase detector can produce a voltage increase signal and the other phase detector can produce a voltage decrease signal in the locking stage.

A charge pump block can include N equal charge pump stages and can be coupled to one or both phase detector output terminals, and an output of each charge pump is combined in the sample-and-hold circuit. In the locking state, the amount of charging current and discharging current substantially compensate each other. Hence, no fractional ripple occurs. Thus, fractional compensation is dynamic and robust to the environmental changes such as circuit age, process and temperature in the preferred embodiments according to the present invention. Preferred embodiments of a frequency synthesizer can be implemented using a plurality of phase detectors with a sample-and-hold circuit to provide a uniform stable VCO control voltage.

The foregoing embodiments are merely exemplary and are not to be construed as limiting the present invention. The present teaching can be readily applied to other types of apparatuses and methods. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A phase locked loop, comprising:
  a first phase detector that receives an input signal and a first divided signal to output a first comparison signal;
  a second phase detector that receives the input signal and a second divided signal to output a second comparison signal;
  a sample-and-hold circuit that receives the first and second comparison signals and generates an output signal responsive to the comparison signals;
  a voltage-controlled oscillator that receives the output signal from the sample-and-hold circuit and generates a prescribed frequency signal; and
  a modulus divider that receives the prescribed frequency signal and generates the first and second divided signals having a prescribed phase relationship.

2. The phase-locked loop of claim 1, further comprising a plurality of parallel switches operated by a control line, wherein each of the switches couple a corresponding one of a plurality of charge pumps to a selected one of the first and second comparison signals, depending on the position of said each switch.

3. The phase-locked loop of claim 2, wherein each of the charge pumps performs one of sourcing and sinking a prescribed amount of current to the sample-and-hold circuit.

4. The phase-locked loop of claim 1, wherein the first phase detector comprises:
  a phase detector portion with a first output port and a second output port; and
  a charge pump portion having a plurality of charge pump stages.

5. The phase-locked loop of claim 4, wherein each of the charge pump stages comprises:
  a first current source and a first switch coupled in series between a first prescribed voltage and a charge pump output terminal;
  a second current source and a second switch coupled in series between a second prescribed voltage and the charge pump output terminal;
  a first logic gate with a first input coupled to the first output port of the phase detector portion, a second input that receives a control signal and an output port coupled to the first switch; and
  a second logic gate with a first input coupled to the second output port of the phase detector portion, a second input that receives the control signal and an output port coupled to the second switch.

6. The phase-locked loop of claim 5, wherein the first and second logic gates are AND gates, wherein an output of the first and second AND gates select one of the first and second switches to couple the charge pump output terminal to one of the first and second current sources.

7. The phase-locked loop of claim 1, further comprising a detection circuit coupled to adjust a reference voltage in the sample-and-hold circuit.

8. The phase-locked loop of claim 1, wherein the sample-and-hold circuit comprises:
  a first switch and a first capacitor coupled at a first node in series between first and second prescribed reference voltages, wherein the first node is coupled to receive the first and second comparison signals;
  a second capacitor coupled between the second reference voltage and a second node; and
  a second switch coupled between the first and second nodes.

9. The phase-locked loop of claim 8, further comprising a detection circuit that sets the first prescribed reference voltage.

10. The phase-locked loop of claim 9, wherein the detection circuit comprises:
  a lock detector that receives the comparison signals from the first and second phase detectors; and
  a digital-to-analog converter that adjusts a voltage level of the first prescribed reference voltage responsive to a control signal from the lock detector.

11. The phase-locked loop of claim 9, wherein the detection circuit comprises:
  an analog-to-digital converter that receives the output of the sample-and-hold circuit; and
  a digital-to-analog converter that adjusts a voltage level of the first prescribed reference voltage responsive to a control signal from the analog-to-digital converter.

12. The phase-locked loop of claim 9, wherein the detection circuit comprises:
  a lock detector that receives the output signal from the sample-and-hold circuit; and
  a digital-to-analog converter that adjusts a voltage level of the first prescribed reference voltage responsive to a control signal from the lock detector.

13. The phase-locked loop of claim 1, wherein the first and second divided signals have the same frequency, wherein the first and second divided signals differ in phase by a period of the clock signal, and wherein the first phase detector and the second phase detector are of the same design.

14. The phase-locked loop of claim 1, wherein the modulus divider comprises:
  a first logic gate;
  a second logic gate that receives a control signal;
  a first flip-flop coupled to receive an output signal of the first logic gate and a clock signal from the output port of the voltage-controlled oscillator;
  a second flip-flop gate coupled to receive an output signal of the first flip-flop, wherein the first and second logic gates receive an output signal of the second flip-flop; and
  a third flip-flop coupled to receive an output signal from the second logic gate, wherein the first, second and third flip-flops receive the prescribed frequency signal as a clock signal, wherein an output signal of the third flip-flop is received by the first logic gate, and wherein the output signals of the first and second flip-flops are the divided signals.

15. The phase-locked-loop of claim 1, wherein said prescribed phase relationship corresponds to a predetermined phase difference.

16. The phase-locked-loop of claim 15, wherein said predetermined phase difference corresponds to one period of a voltage-controlled oscillator frequency.

17. A fractional-N frequency synthesizer for a mobile terminal, comprising:

a phase detector circuit that comprises,
- a first phase detector having a first input port coupled to receive a reference signal, a second input port, a third input port and an output port, and
- a second phase detector having a first input port coupled to receive the reference signal, a second input port, a third input port and an output port;

a sample-and-hold circuit having a first input port coupled to the output ports of the first and second phase detectors and an output port;

a voltage-controlled oscillator having an input port coupled to the output port of the sample-and-hold circuit and transmitting a prescribed frequency signal at an output port;

a programmable modulus divider having a first output port coupled to the second input port of the first phase detector to transmit a first divided signal, a second output port coupled to the second input port of the second phase detector to transmit a second divided signal, a first input port coupled to the output port of the voltage-controlled oscillator and a second input port; and an accumulator having a first output port coupled to the second input port of the programmable modulus divider and a second output port coupled to the third input ports of the phase detectors.

18. The fractional-N frequency synthesizer of claim 17, wherein the mobile terminal is one of a cellular phone, a personal digital assistant, a digital audio player, an Internet appliance, a remote control device and a laptop computer.

19. The fractional-N frequency synthesizer of claim 17, further comprising a plurality of switches operated by a control line, wherein each of the switches couple a corresponding one of a plurality of charge pumps to the output port of a selected one of the first phase detector and the second phase detector according to a control signal from the accumulator.

20. The fractional-N frequency synthesizer of claim 17, wherein the first phase detector comprises:

a phase detector portion with a first output port and a second output port; and a charge pump portion having a plurality of charge pump stages.

21. The fractional-N frequency synthesizer of claim 20, wherein each of the charge pump stages comprises:

a first current source and a first switch coupled in series between a first prescribed voltage and a charge pump output terminal;

a second current source and a second switch coupled in series between a second prescribed voltage and the charge pump output terminal;

a first logic gate with a first input port coupled to the first output port of the phase detector portion, a second input that receives a control signal and an output port coupled to the first switch; and a second logic gate with a first input coupled to the second output port of the phase detector portion, a second input that receives the control signal and an output port coupled to the second switch.

22. The phase-locked loop of claim 17, wherein the sample-and-hold circuit comprises:

a first switch and a first capacitor coupled at a first node in series between first and second prescribed reference voltages, wherein the first node is coupled to receive first and second comparison signals from the output ports of the phase detectors;

a second capacitor coupled between the second reference voltage and a second node; and a second switch coupled between the first and second nodes.

23. The phase-locked loop of claim 22, further comprising a detection circuit that sets the first prescribed reference voltage.

24. The phase-locked loop of claim 23, wherein the detection circuit comprises:

a lock detector that receives the comparison signals from the first and second phase detectors; and a digital-to-analog converter that adjusts a voltage level of the first prescribed reference voltage responsive to a control signal from the lock detector.

25. The phase-locked loop of claim 23, wherein the detection circuit comprises:

an analog-to-digital converter that inputs an output signal of the sample-and-hold circuit; and a digital-to-analog converter that adjusts a voltage level of the first prescribed reference voltage responsive to a control signal from the analog-to-digital converter.

26. The fractional-N frequency synthesizer of claim 17, wherein the programmable modulus divider comprises:

a first logic gate;

a second logic gate that receives a control signal;

a first flip-flop coupled to receive an output signal of the first logic gate and a clock signal from the output port of the voltage-controlled oscillator;

a second flip-flop gate coupled to receive an output signal of the first flip-flop, wherein the first and second logic gates receive an output signal of the second flip-flop;

a third flip-flop coupled to receive an output signal from the second logic gate, wherein the first, second and third flip-flops receive the prescribed frequency signal as a clock signal, wherein an output signal of the third flip-flop is received by the first logic gate, and wherein the output signals of the first and second flip-flops are the divided signals.

27. The fractional-N frequency synthesizer of claim 17, wherein the first and second divided signals have the same frequency, and wherein the first and second divided signals differ in phase by the period of the prescribed frequency signal from the output port of the voltage-controlled oscillator, and wherein the first phase detector and the second phase detector are of the same design.

28. A method for generating frequency signals, comprising:

dividing a frequency signal output from an oscillator by a first value to produce a first divided signal;

dividing a frequency signal output from an oscillator by a second value to produce a second divided signal;

comparing the first divided signal to a reference signal to generate a first control signal;

comparing the second divided signal to said reference signal to generate a second control signal;

passing the first control signal and the second control signal through a sample-and-hold circuit, wherein the first control signal increases a charge of a capacitor of the sample-and-hold circuit and the second control signal decreases the charge of the capacitor of the sample-and-hold circuit; and adjusting the oscillator based on an output of the sample-and-hold circuit.

29. The method of claim 28, further comprising:

selecting the first value and the second value so that the first divided signal and the second divided signal have a predetermined phase difference.

30. The method of claim 29, wherein said predetermined phase difference corresponds to one period of a voltage-controlled oscillator frequency.

31. A phase-locked-loop, comprising:

an oscillator;

a divider which divides a frequency signal output from the oscillator by a first value to produce a first divided signal and by a second value to produce a second divided signal;

a first phase detector which compares the first divided signal to a reference signal to generate a first comparison signal;

a second phase detector which compares the second divided signal to said reference signal to generate a second comparison signal; and a sample-and-hold unit which generates a control signal for adjusting the oscillator based on the first comparison signal and the second comparison signal.

32. The phase-locked-loop of claim 31, wherein the first value and the second value generate a predetermined phase difference in the first divided signal and the second divided signal.

33. The phase-locked-loop of claim 32, wherein said predetermined phase difference corresponds to one period of the oscillator frequency.

* * * * *